(12) United States Patent
Sumi et al.

(10) Patent No.: US 9,373,954 B2
(45) Date of Patent: Jun. 21, 2016

(54) ESD PROTECTION DEVICE AND METHOD FOR PRODUCING THE SAME

(71) Applicant: Murata Manufacturing Co., Ltd., Kyoto (JP)

(72) Inventors: Takahiro Sumi, Kyoto (JP); Kumiko Ishikawa, Kyoto (JP); Jun Adachi, Kyoto (JP); Takayuki Tsukizawa, Kyoto (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 237 days.

(21) Appl. No.: 14/332,638

(22) Filed: Jul. 16, 2014

(65) Prior Publication Data

US 2014/0327993 A1    Nov. 6, 2014

Related U.S. Application Data

(63) Continuation of application No. PCT/JP2013/054628, filed on Feb. 23, 2013.

(30) Foreign Application Priority Data

Feb. 29, 2012  (JP) ................................. 2012-042739

(51) Int. Cl.
*H02H 3/00* (2006.01)
*H02H 9/04* (2006.01)
(Continued)

(52) U.S. Cl.
CPC .. *H02H 9/04* (2013.01); *H01T 1/20* (2013.01); *H01T 4/12* (2013.01); *H05K 1/026* (2013.01); *Y10T 29/49206* (2015.01)

(58) Field of Classification Search
CPC .............................. H02H 9/041; H02H 9/046

USPC ............................................................ 361/56
See application file for complete search history.

(56) References Cited

U.S. PATENT DOCUMENTS

| 8,238,069 B2 | 8/2012 | Adachi | |
| 8,455,918 B2 * | 6/2013 | Adachi | ..................... H01T 1/20 257/173 |

(Continued)

FOREIGN PATENT DOCUMENTS

| CN | 101933204 A | 12/2010 |
| CN | 102224648 A | 10/2011 |

(Continued)

OTHER PUBLICATIONS

International Search Report issued in Application No. PCT/JP2013/054628 dated Mar. 26, 2013.

(Continued)

*Primary Examiner* — Dharti Patel
(74) *Attorney, Agent, or Firm* — Pearne & Gordon LLP

(57) ABSTRACT

Provided is an ESD protection device having excellent discharge characteristics at a low applied voltage. An ESD protection device includes a first discharge electrode and a second discharge electrode that are disposed so as to face each other, a discharge auxiliary electrode formed so as to span between the first discharge electrode and the second discharge electrode, and an insulator base that holds the first discharge electrode, the second discharge electrode, and the discharge auxiliary electrode. The discharge auxiliary electrode includes a plurality of metal particles (22) containing a first metal as a main component. Fine irregularities are formed on the surfaces of the metal particles (22). More specifically, the metal particles (22) has a fractal dimension D of 1.03 or more. Since electric charges are concentrated on the fine irregularities, discharge can be generated in the discharge auxiliary electrode by applying a relatively low voltage.

19 Claims, 6 Drawing Sheets

(51) Int. Cl.
*H01T 1/20* (2006.01)
*H01T 4/12* (2006.01)
*H05K 1/02* (2006.01)

(56) References Cited

U.S. PATENT DOCUMENTS

| | | | |
|---|---|---|---|
| 8,847,726 B2 | 9/2014 | Ikeda | |
| 2010/0169452 A1* | 7/2010 | Atluri | H04L 12/413 709/215 |
| 2010/0309595 A1* | 12/2010 | Adachi | H01T 1/20 361/56 |
| 2012/0099231 A1* | 4/2012 | Ishihara | C08G 18/0823 361/56 |

FOREIGN PATENT DOCUMENTS

| | | |
|---|---|---|
| CN | 102299485 A | 12/2011 |
| JP | 2008-085284 A | 4/2008 |
| WO | 2009/098944 A1 | 8/2009 |
| WO | 2010/061519 A1 | 6/2010 |
| WO | 2011/040437 A1 | 4/2011 |
| WO | 2011/096335 A1 | 8/2011 |

OTHER PUBLICATIONS

Written Opinion issued in Application No. PCT/JP2013/054628 dated Mar. 26, 2013.
Office Action issued in corresponds Chinese Patent Application No. 201380011765.9 dated Jun. 3, 2015.

* cited by examiner

ESD PROTECTION DEVICE AND METHOD FOR PRODUCING THE SAME

BACKGROUND OF THE INVENTION

1. Field of the Invention

The present invention relates to an electrostatic discharge (ESD) protection device and a method for producing the same. In particular, the present invention relates to an improvement in a discharge auxiliary electrode provided for the purpose of accelerating electrostatic discharge in an ESD protection device.

2. Description of the Related Art

An overvoltage protection element that is interesting to the present invention is described in, for example, Japanese Unexamined Patent Application Publication No. 2008-85284 (Patent Document 1).

Patent Document 1 describes an overvoltage protection element material which is to become a discharge auxiliary electrode provided for the purpose of accelerating discharge. The material contains a non-conductor powder (for example, silicon carbide: particle size 1 to 50 µm) and a metal conductor powder (for example, copper: particle size 0.01 to 5 µm), and an adhesive (for example, glass powder).

In addition, Patent Document 1 describes a method for producing an overvoltage protection element, the method including a step of preparing a material paste by uniformly mixing a non-conductor powder, a metal conductor powder, and an adhesive at a particular ratio, a step of printing the material paste on a substrate, and a step of conducting a firing process (temperature: 300° C. to 1,200° C.) on the substrate.

However, there is a limitation in enhancing discharge characteristics in the overvoltage protection element described in Patent Document 1. The reason for this is as follows. In the overvoltage protection element described in Patent Document 1, in order to enhance discharge characteristics, the content ratio of the metal conductor powder to the non-conductor powder may be increased. However, in the case where the content ratio of the metal conductor powder is increased, the metal conductor powder is in a state in which the surface thereof is exposed. Consequently, the exposed metal conductor particles are bound to each other during discharge, which may decrease insulation reliability. Silicon carbide, which is used as a non-conductor powder in the overvoltage protection element described in Patent Document 1, is a semiconductor having a relatively low insulation resistance, and thus silicon carbide does not easily contribute to the improvement in insulation reliability.

For example, International Publication No. 2009/098944 pamphlet (Patent Document 2) describes a technology that can solve the problems described above.

Patent Document 2 describes the use of a discharge auxiliary electrode in which a conductive material (such as a Cu powder) coated with an inorganic material (such as $Al_2O_3$) is dispersed. According to the technology described in Patent Document 2, since the exposure of the conductive material is less than that in the technology described in Patent Document 1, insulation reliability can be enhanced. Furthermore, even when the content of the conductive material is increased, short-circuit between the particles of the conductive material does not easily occur. Thus, discharge occurs more easily by increasing the content of the conductive material. Consequently, the discharge characteristics can be improved.

However, regarding the technology described in Patent Document 1, in order to improve discharge characteristics, there is no solution but to increase the content of the conductive material. Therefore, the improvement in discharge characteristics is limited. Accordingly, it is desirable to find a method for further improving discharge characteristics.

Patent Document 1: Japanese Unexamined Patent Application Publication No. 2008-85284

Patent Document 2: International Publication No. 2009/098944 pamphlet

BRIEF SUMMARY OF THE INVENTION

Accordingly, an object of the present invention is to provide an ESD protection device which can meet the desire described above, more specifically, whose discharge characteristics can be further improved, and a method for producing the ESD protection device.

The present invention provides an ESD protection device including a first discharge electrode and a second discharge electrode that are disposed so as to face each other, a discharge auxiliary electrode formed so as to span between the first discharge electrode and the second discharge electrode, and an insulator base that holds the first discharge electrode, the second discharge electrode, and the discharge auxiliary electrode. In order to solve the above technical problems, the discharge auxiliary electrode includes a plurality of metal particles containing a first metal as a main component, and the metal particles have a fractal dimension D of 1.03 or more.

Metal particles having a fractal dimension D of 1.03 or more have fine irregularities on the surfaces thereof. Since electric charges are concentrated on the fine irregularities, discharge can be generated in the discharge auxiliary electrode by applying a relatively low voltage. The "fractal dimension D" will be described in detail below.

The discharge auxiliary electrode preferably includes an aggregate of a plurality of core-shell structured particles each having a core-shell structure that includes a core portion formed of the metal particles and a shell portion containing, as a main component, a metal oxide containing a second metal. When the metal particles contained in the discharge auxiliary electrode are each completely or substantially completely covered with a shell portion containing a metal oxide as a main component, insulation reliability during discharge can be increased.

In a preferred embodiment, the second metal contained in the shell portion may be more susceptible to oxidization than the first metal contained in the metal particles that form the core portion. In this case, core-shell structured particles each including a core portion containing, as a main component, a first metal and a shell portion containing, as a main component, a metal oxide containing a second metal can be easily obtained by using a production method described below.

In the above embodiment, the first metal is preferably copper or a copper-based alloy containing copper as a main component. In this case, the ESD protection device can be provided at a relatively low cost. Furthermore, since copper has a relatively high melting point, insulation reliability during discharge can be further improved. This is because if the melting point is low, metal particles are melted and sintered by heat during discharge and short-circuit may occur.

In the above embodiment, the metal oxide containing the second metal is preferably aluminum oxide. Aluminum oxide has a high insulating property, and thus insulation reliability during discharge can be further improved.

The metal particles that form the core portion may contain not only the first metal but also the second metal as an auxiliary component. In the case where the metal particles that form the core portion contain the second metal, even when the shell portion is broken for any reason, the shell portion can be repaired by heat during discharge.

In the ESD protection device according to the present invention, the first discharge electrode, the second discharge electrode, and the discharge auxiliary electrode are preferably disposed inside the insulator base, the insulator base preferably has a cavity for disposing a gap between the first discharge electrode and the second discharge electrode, and the ESD protection device preferably further includes a first outer terminal electrode and a second outer terminal electrode that are formed on surfaces of the insulator base and that are respectively electrically connected to the first discharge electrode and the second discharge electrode. In this case, moisture resistance of the ESD protection device can be improved.

The present invention also provides a method for producing an ESD protection device.

A method for producing an ESD protection device according to the present invention includes the steps of preparing an alloy powder composed of an alloy containing a first metal, a second metal that is more susceptible to oxidization than the first metal, and an impurity component having a melting point that is lower than that of the first metal; preparing an insulator base; forming an unfired discharge auxiliary electrode containing the alloy powder on a surface of or inside the insulator base; forming, on a surface of or inside the insulator base, a first discharge electrode and a second discharge electrode that are disposed so as to face each other on the discharge auxiliary electrode; and firing the unfired discharge auxiliary electrode.

The step of firing the unfired discharge auxiliary electrode includes the steps of, in each of particles constituting the alloy powder, conducting heat treatment in an atmosphere having an oxygen concentration at which the first metal is not oxidized and the second metal is oxidized in order to obtain core-shell structured particles that include a shell portion containing a metal oxide containing the second metal, the metal oxide being formed by moving the second metal toward the surface of the particle and oxidizing the second metal at the time when the second metal reaches the surface, and a core portion containing metal particles containing, as a main component, the first metal that is left as a result of the movement of the second metal toward the surface of the particle; and deforming the metal particles that form the core portion in the core-shell structured particles such that a fractal dimension D becomes 1.03 or more.

Any of the step of forming the discharge auxiliary electrode and the step of forming the first discharge electrode and the second discharge electrode may be performed earlier.

The alloy powder is preferably produced by using an atomizing method. The composition of an alloy can be easily controlled by employing an atomizing method. The inventor of the present invention has found that the thickness of the shell portion formed of a metal oxide containing the second metal can be controlled in the firing step by changing the composition ratio of the first metal and the second metal that constitute an alloy. It has also been found that the thickness of the shell portion formed of a metal oxide containing the second metal can be controlled by changing the particle size of metal particles that constitute an alloy powder.

The impurity component contained in the alloy powder is preferably at least one selected from bismuth, phosphorus, and silver. There impurity components are advantageous in that the impurity components have a relatively high effect of causing deformation of metal particles that form a core portion in the firing step while the cost thereof is relatively low.

According to the ESD protection device of the present invention, a discharge auxiliary electrode contains metal particles that have, on the surfaces thereof, fine irregularities having a fractal dimension D of 1.03 or more. Consequently, electric charges can be concentrated on the fine irregularities, and thus discharge characteristics at a low applied voltage can be improved.

Accordingly, the ESD protection device of the present invention can be widely used for protecting various apparatuses or devices such as a semiconductor device.

According to the method for producing an ESD protection device of the present invention, in the firing step, metal particles that form a core portion in core-shell structured particles can be deformed in the firing step such that the fractal dimension becomes 1.03 or more. Accordingly, fine irregularities having a fractal dimension D of 1.03 or more can be easily and efficiently provided to the surfaces of the metal particles contained in a discharge auxiliary electrode.

DETAILED DESCRIPTION OF THE INVENTION

Figure 1:
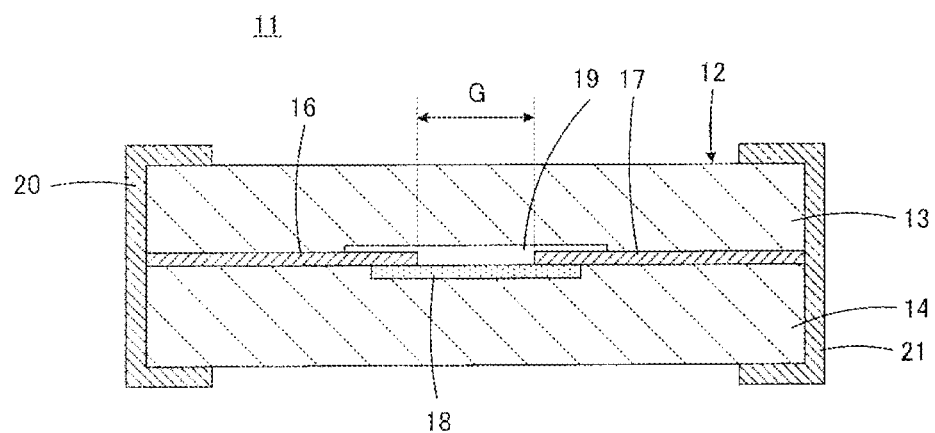
FIG. 1 is a cross-sectional view showing an ESD protection device 11 according to an embodiment of the present invention.

An ESD protection device 11 according to an embodiment of the present invention will be described with reference to FIG. 1.

An ESD protection device 11 includes an insulator base 12. The insulator base 12 is composed of a low-temperature co-fired ceramic (LTCC) such as a glass ceramic, a high-temperature co-fired ceramic (HTCC) such as aluminum nitride or alumina, or a magnetic ceramic such as ferrite. The insulator base 12 has a layered structure including at least an upper layer portion 13 and a lower layer portion 14.

A first discharge electrode 16 and a second discharge electrode 17 are provided inside the insulator base 12 and between the upper layer portion 13 and the lower layer portion 14. The first discharge electrode 16 and the second discharge electrode 17 are arranged so as to face each other with a predetermined gap G therebetween. A discharge auxiliary electrode 18 is also provided inside the insulator base 12 and between the upper layer portion 13 and the lower layer portion 14 so as to span between the first discharge electrode 16 and the second discharge electrode 17. The portion where the gap G in the insulator base 12 is located forms a cavity 19.

A first outer terminal electrode 20 and a second outer terminal electrode 21 are formed on outer surfaces of the insulator base 12. The first outer terminal electrode 20 and the second outer terminal electrode 21 are electrically connected to the first discharge electrode 16 and the second discharge electrode 17, respectively.

Figure 2:
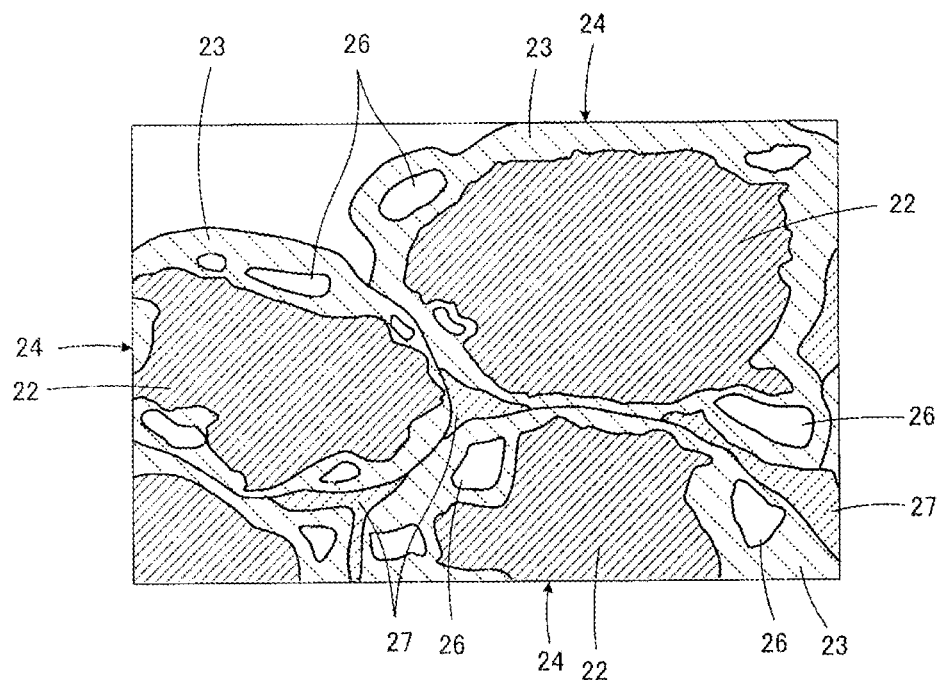
FIG. 2 is an enlarged cross-sectional view showing a plurality of metal particles 24 constituting a discharge auxiliary electrode 18 shown in FIG. 1.

In this ESD protection device 11, as shown in FIG. 2, the discharge auxiliary electrode 18 includes a plurality of metal particles 22 containing a first metal as a main component. Preferably, the discharge auxiliary electrode 18 is constituted by an aggregate of a plurality of core-shell structured particles 24 having a core-shell structure including the metal particles 22 serving as a core portion and a shell portion 23 containing, as a main component, a metal oxide containing a second metal. In this manner, when the metal particles 22 included in the discharge auxiliary electrode 18 are formed so as to constitute the core portion of the core-shell structured particles 24 that are completely or substantially completely covered with the shell portion 23 containing a metal oxide as a main component, insulation reliability during discharge can be increased. It should be noted that the shell portion 23 is not in a state where fine particles are gathered but is formed in the form of a film, as shown in FIG. 2.

In the core-shell structured particles 24, a portion that is not covered with the shell portion 23 containing a metal oxide as a main component may be slightly present as long as the insulation reliability is not substantially impaired. It is defined that the "core-shell structure" in the present invention is achieved when a ratio L2/L1 is 75% or more where L1 represents the length of the entire circumference of the metal particle 22 of a core-shell structured particle 24 and L2 represents the length of the circumference of the metal particle 22 covered with the shell portion 23.

Pores 26 are preferably formed in at least a part of the shell portion 23. When the pores 26 are present in the shell portion 23 in this manner, the shell portion 23 has a small thickness in the periphery of the pores 26. Therefore, discharge can be started by applying a relatively low ESD voltage.

Fine irregularities are formed on the surfaces of the metal particles 22 that form the core portion. In order to clarify the scope of the present invention, the irregularities on the surface of a metal particle 22 are specified in terms of a fractal dimension D. When the fractal dimension D is 1.03 or more, it is defined that the metal particle is within the scope of the present invention. The fractal dimension D can be calculated by, for example, a divider method described in Toshio Oshima, "Divider method" Journal of the Society of Powder Technology, Japan, 25, 1988, pp. 287-291.

Figure 3:
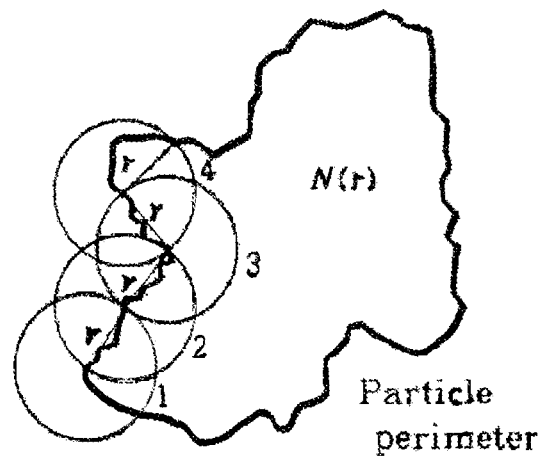
FIG. 3 is a figure for explaining a fractal dimension D, which is an index showing the degree of irregularities on the surface of a metal particle and used in the present invention, and is a view showing a particle projection image.

More specifically, a particle projection image contour which is a complicated curve shown in FIG. 3 is approximated by a broken line with a set of segments having a length of r. First, an arbitrary point on the curve is determined as a starting point, and a circle having a radius of r is drawn with the point as the center. The starting point and a point at which the circle first intersects with the curve are joined with a straight line. Next, the intersecting point is newly used as a starting point, and the same operation is repeated. The number of segments necessary to achieve a broken-line approximation of the contour of a particle projection image with a set of segments having a length of r in this manner is defined as N(r). When the length r of the segment used as a reference is changed, the number N(r) changes.

Figure 4:
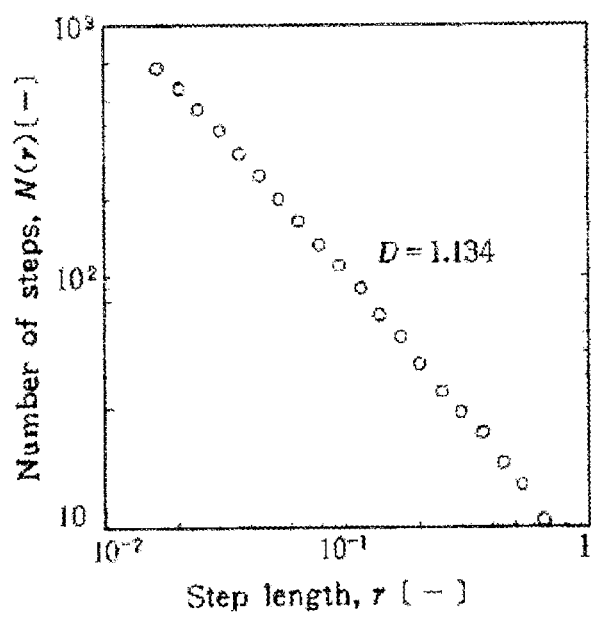
FIG. 4 is a graph prepared for the purpose of determining the fractal dimension D of the contour of the particle projection image shown in FIG. 3.

As shown in FIG. 4, the length r and the number N(r) are plotted on a double logarithmic scale (Richardson plot) to obtain a straight line. The fractal dimension D of the contour is calculated by multiplying the slope of the straight line by −1. The fractal dimension D is represented by the following formula.

$$N(r) \propto r^{-D}$$

When this is applied to a particle which has a smooth surface and whose projection image is substantially a circle, by multiplying r by 1/a (where a is an arbitrary real number), N(r) apparently becomes a times larger. Accordingly, the fractal dimension D becomes 1. However, regarding a particle having irregularities on the surface thereof, when the length r of the reference segment is decreased, small irregularities on the surface of the particle, which do not appear when r is large, appear in the broken-line approximation. Consequently, N(r) is increased by an amount that is equal to or larger than the amount corresponding to the decrease in r. The more complicated the irregularities on the surface of the particle become, the larger this increase in r. Accordingly, the complicatedness of irregularities on the surface of a particle, that is, the shape of a particle can be represented by the fractal dimension D, which represents the ratio of increase.

In general, the fractal dimension D is determined as an average of the fractal dimensions D of a plurality of metal particles. More specifically, in the case where the fractal dimension D is determined as an average of the fractal dimension D of, for example, 20 metal particles, these 20 metal particles are selected, for example, in descending order of size among a plurality of metal particles present in the field of view in the observation with a scanning transmission electron microscope (STEM).

Referring to FIG. 2 again, when the metal particles 22 have a fractal dimension D of 1.03 or more, as a result of the presence of irregularities on the surfaces, electric charges are easily concentrated on depressions of the irregularities on the surfaces. Accordingly, discharge occurs more easily to improve the discharge characteristics. In particular, a lower peak voltage can be realized.

In the discharge auxiliary electrode 18, the plurality of core-shell structured particles 24 are preferably bound to each other with a glass-containing substance 27. With this structure, degradation of the peak voltage characteristics after drop impact can be suppressed.

When a metal that is more susceptible to oxidization than the first metal is used as the second metal, a plurality of the core-shell structured particles 24 having a core-shell structure including the metal particles 22 containing, as a main component, the first metal and the shell portion 23 containing, as a main component, a metal oxide that contains the second metal can be easily obtained by using a production method described below.

For example, copper or a copper-based alloy containing copper as a main component is used as the first metal. When copper or a copper-based alloy is used as the first metal, for example, aluminum, nickel, bismuth, gallium, germanium, indium, magnesium, phosphorus, silicon, or tin can be used as the second metal. When copper or a copper-based alloy is used as the first metal and the discharge auxiliary electrode 18 is co-fired with the insulator base 12, the insulator base 12 is preferably composed of an LTCC.

Besides the above metals, silver, aluminum, molybdenum, tungsten, or the like can also be used as the first metal. In any case, a metal that is more susceptible to oxidization than the first metal is selected as the second metal.

As described above, a metal that is more susceptible to oxidization than the first metal is selected as the second metal. The metal oxide containing the second metal is particularly preferably aluminum oxide. This is because aluminum oxide has a high insulating property and thus insulation reliability during discharge can be further improved.

The ESD protection device 11 is produced, for example, as follows.

First, a plurality of ceramic green sheets which are to become an insulator base 12 are prepared. Among the plurality of ceramic green sheets, a first ceramic green sheet is used for forming, for example, a lower layer portion 14 of the insulator base 12, and a second ceramic green sheet is used for forming an upper layer portion 13 of the insulator base 12.

An alloy powder used for forming a discharge auxiliary electrode 18 and composed of an alloy containing a first metal and a second metal that is more susceptible to oxidization than the first metal is prepared. The alloy powder further contains an impurity component having a melting point that is lower than that of the first metal. Preferably, at least one selected from bismuth, phosphorus, and silver is used as the impurity component. The alloy powder is preferably produced by an atomizing method. The composition of an alloy is easily controlled by the atomizing method.

Next, an unfired paste film which is to become the discharge auxiliary electrode 18 is formed on the first ceramic green sheet so as to have a predetermined pattern by using a paste containing the alloy powder. For example, SiC may be incorporated in the paste for forming the discharge auxiliary electrode 18 in a range that satisfies desired characteristics.

Next, a first discharge electrode 16 and a second discharge electrode 17 are formed on the paste film serving as the unfired discharge auxiliary electrode 18 on the first ceramic green sheet so as to face each other with a predetermined gap G therebetween. The discharge electrodes 16 and 17 are formed by, for example, applying a conductive paste.

Next, a thermally removable layer is formed so as to cover the gap G between the first discharge electrode 16 and the second discharge electrode 17. The thermally removable layer is a layer that is removed by being burnt away in a firing step described below to leave the cavity 19 inside the insulator base 12. The thermally removable layer is formed by, for example, using a paste containing resin beads.

The pastes used for forming the discharge auxiliary electrode 18, the first discharge electrode 16, the second discharge electrode 17, and the thermally removable layer may be applied either directly onto an object or by using a transfer method or the like.

Next, a second ceramic green sheet is stacked and pressure-bonded on the first ceramic green sheet so as to cover the unfired discharge auxiliary electrode 18, the first discharge electrode 16, the second discharge electrode 17, and the thermally removable layer. As a result, an unfired insulator base 12 is obtained.

Next, a first outer terminal electrode 20 and a second outer terminal electrode 21 are formed on surfaces of the unfired insulator base 12. The first outer terminal electrode 20 and the second outer terminal electrode 21 are formed by, for example, applying a conductive paste.

Next, a firing step is performed. As a result of this firing step, an insulator base 12 including sintered ceramic green sheets is obtained, and the discharge electrodes 16 and 17, the discharge auxiliary electrode 18, and the outer terminal electrodes 20 and 21 are sintered. Furthermore, the thermally removable layer is removed by being burnt away, and a cavity 19 is formed inside the insulator base 12.

An ESD protection device 11 is produced as described above.

In performing the firing step, when, in particular, the phenomenon that occurs in each of alloy particles constituting the alloy powder included in the discharge auxiliary electrode 18 is focused on, the firing step is divided into steps of two stages, namely, (1) a step of forming a core-shell structure and (2) a step of deforming a core portion. Each of the steps will be described in detail below.

(1) Step of Forming Core-Shell Structure

This step is performed in an atmosphere having an oxygen concentration at which the first metal contained in an alloy powder included in the unfired discharge auxiliary electrode 18 is not oxidized and the second metal is oxidized. This step is usually achieved in a temperature-increasing process in a firing profile. A purpose of this step is, in each of alloy particles constituting the alloy powder, to form a core-shell structured particle including a metal particle that serves as a core portion containing, as a main component, the first metal that is left as a result of a movement of the second metal toward the surface of the alloy particle, and a shell portion containing, as a main component, a metal oxide that contains the second metal, the metal oxide being formed by oxidizing the second metal at the time when the second metal reaches the surface.

Figure 5:
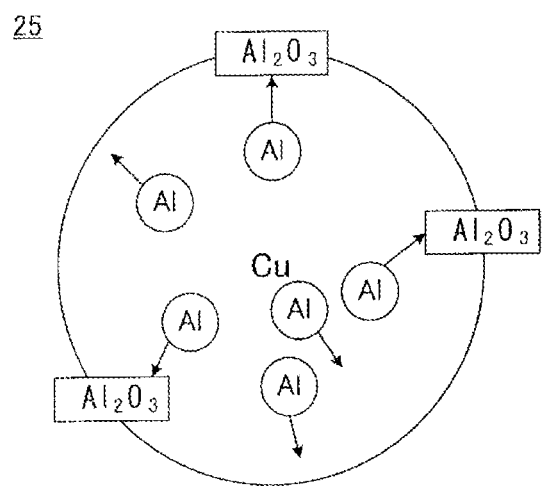
FIG. 5 is a cross-sectional view that schematically shows the behavior of aluminum (Al), which serves as a second metal generated in a firing step, in an alloy particle 25 prepared for obtaining a metal particle 24 shown in FIG. 2.

This step will be described more specifically with reference to FIG. 5 under the assumption that the first metal contained in the alloy is Cu and the second metal contained in the alloy is Al. FIG. 5 schematically shows a single alloy particle 25 that forms an alloy powder.

In the temperature-increasing process in the firing profile, Al in the alloy particle 25 containing Cu and Al moves toward the surface of the alloy particle 25, as shown by the arrows, oxidized at the time when the Al reaches the surface, and changed to $Al_2O_3$. Accordingly, a shell portion of the alloy particle 25 is formed by $Al_2O_3$. As is found from this phenomenon, Al which is the second metal may remain in the core portion of the alloy particle 25.

The temperature in this step is not particularly limited, but the step is preferably performed in the range of 500° C. to 900° C. At a temperature lower than 500° C., the movement of the second metal component to the surface of an alloy particle is slow, and a shell portion having a sufficient thickness and sufficient uniformity may not be formed. On the other hand, at a temperature higher than 900° C., the movement of the second metal component to the surface of an alloy particle becomes nonuniform, and a shell having a sufficient thickness and sufficient uniformity may not be formed.

The oxygen concentration in this step is set to a value at which the first metal component contained in the alloy particle is not oxidized and the second metal component is oxidized. The oxygen concentration is not particularly limited as long as this condition is satisfied.

The holding time in this step is preferably set to at least 30 to 800 minutes in the range of 500° C. to 900° C. When the holding time is shorter than 30 minutes, the movement of the second metal component to the surface of an alloy particle is insufficient, and a shell having a sufficient thickness and sufficient uniformity may not be formed. When the holding time is longer than 800 minutes, productivity significantly decreases.

(2) Step of Deforming Core Portion

This step is usually achieved from a maximum temperature-maintaining process to a temperature-decreasing process in the firing profile. A purpose of this step is to deform the metal particles 22 serving as a core portion that contains the first metal as a main component so as to have a fractal dimension D of 1.03 or more, as shown in FIG. 2.

In general, a metal has a thermal expansion coefficient that is larger than that of an oxide. Therefore, the core portion containing a metal as a main component shrinks more significantly than the shell portion containing an oxide as a main component. In this step, this property is utilized after the joining of the shell portion and a metal particle serving as a core portion in a core-shell structured particle is achieved in the maximum temperature-maintaining process and when the firing profile is transferred to the temperature-decreasing process. In the shrinking of the core portion, the core portion receives a constraining force from the shell portion. It is believed that this constraining force is not uniform over the entire surface of the core portion but is different depending on the position, and thus the degree of shrinking is different depending on the position. As a result, as shown in FIG. 2, irregularities are formed on the surfaces of the metal particles 22 serving as the core portion.

The impurity component having a melting point that is lower than that of the first metal contained in the alloy powder facilitates the deformation of the metal particles serving as the core portion. The impurity component is preferably at least one selected from bismuth, phosphorus, and silver, as described above. There impurity components are advantageous in that the impurity components have a relatively high effect of causing deformation of metal particles that form a core portion in the firing step while the cost thereof is relatively low.

As described with reference to FIG. 2, pores 26 are present in the shell portion 23. It is believed that these pores 26 are generated as follows. Specifically, when the above-described nonuniform shrinkage occurs in the metal particles 22 serving as the core portion, part of the shell portion 23 is shrunk together with the shrinkage of the metal particles 22. Accordingly, a structural break occurs in the shell portion 23. As a result, the pores 26 are generated in the shell portion 23.

The temperature in this step is not particularly limited. However, it is necessary to perform this step at a temperature lower than the melting point of the first metal component. When the temperature in this step is set to a temperature equal to or higher than the melting point of the first metal component, the core portion is melted and the core-shell structure is thereby broken.

The oxygen concentration in this step is preferably set to a value at which the second metal component is not reduced. More preferably, the oxygen concentration is set to a value at which the first metal component is not oxidized and the second metal component is oxidized.

As a result of the firing step described above, preferably, a state where a plurality of core-shell structured particles 24 are bound to each other with a glass-containing substance 27 is obtained in the discharge auxiliary electrode 18. This glass-containing substance 27 is generated, for example, as follows.

Specifically, in the case where the insulator base 12 contains a glass-containing substance, for example, in the case where the insulator base 12 is composed of a low-temperature co-fired ceramic (LTCC) such as a glass ceramic, in the firing step, the glass-containing substance 27 is diffused into the discharge auxiliary electrode 18 so as to form a state where the plurality of core-shell structured particles 24 are bound to each other with the glass-containing substance 27. Alternatively, the state where the plurality of core-shell structured particles 24 are bound to each other with the glass-containing substance 27 can be obtained by employing, for example, a method in which glass itself is incorporated in the unfired discharge auxiliary electrode 18 in advance, a method in which a substance that generates glass during firing is incorporated in the unfired discharge auxiliary electrode 18 in advance, a method in which glass is generated by a reaction with the shell portion 23 during firing, or a method in which part of an oxide containing the second metal, the oxide serving as a main component of the shell portion 23, is changed to an amorphous component during firing.

Furthermore, modifications described below may be made within the scope of the present invention.

In the embodiment shown in the figure, the discharge electrodes 16 and 17 and the discharge auxiliary electrode 18 are disposed inside the insulator base 12. Alternatively, the discharge electrodes 16 and 17 and the discharge auxiliary electrode 18 may be disposed on an outer surface of an insulator base.

Even in the case where the discharge electrodes 16 and 17 and the discharge auxiliary electrode 18 are disposed inside the insulator base 12, the cavity 19 is not necessarily formed.

In the production method described above, the firing for sintering the discharge electrodes 16 and 17 and the discharge auxiliary electrode 18 and the firing for sintering the insulator base 12 are performed at the same time. Alternatively, an insulator base composed of a sintered ceramic may be prepared in advance, and discharge electrodes and a discharge auxiliary electrode may be formed on the insulator base.

Next, experimental examples that were conducted in order to confirm the effects of the present invention will be described.

[Experimental Example]

<Preparation of Evaluation Samples>

(1) Preparation of Ceramic Green Sheet

Materials containing Ba, Al, and Si as main components were prepared as ceramic materials. The materials were mixed so as to have a predetermined composition, and calcined at 800° C. to 1,000° C. The resulting calcined powder was pulverized with a zirconia ball mill for 12 hours to prepare a ceramic powder.

Next, an organic solvent containing toluene and Ekinen was added to the ceramic powder, and the organic solvent and the powder were mixed. Subsequently, a binder and a plasticizer were further added thereto, and the resulting mixture was again mixed to prepare a slurry.

Next, the slurry was formed by a doctor blade method to prepare ceramic green sheets each having a thickness of 50 μm. One of the ceramic green sheets prepared in this step is shown as a ceramic green sheet 31 in FIGS. 6 to 10, and another one of the ceramic green sheets is shown as a ceramic green sheet 36 in FIGS. 9 and 10.

(2) Preparation of Paste for Discharge Auxiliary Electrode

TABLE 1

| Paste symbol | Type of metal | Composition (mol %) | | Impurity (weight ppm) | | | D50 (μm) | Fractal dimension D before firing |
|---|---|---|---|---|---|---|---|---|
| | | Cu | Al | Bi | Ag | P | | |
| *P-1 | Cu—Al-based alloy | 80 | 20 | — | — | — | 2.5 | 1.01 |
| P-2 | Cu—Al-based alloy | 80 | 20 | 200 | — | — | 2.5 | 1.01 |
| P-3 | Cu—Al-based alloy | 80 | 20 | 1000 | — | — | 2.5 | 1.01 |
| P-4 | Cu—Al-based alloy | 80 | 20 | — | 200 | — | 2.5 | 1.01 |
| P-5 | Cu—Al-based alloy | 80 | 20 | — | — | 200 | 2.5 | 1.01 |

Pastes P-1 to P-5 for discharge auxiliary electrodes, the pastes containing the metal powders shown in Table 1, were prepared. In Table 1, the paste symbol marked with * represents a paste for a discharge auxiliary electrode, the paste being out of the scope of the present invention.

More specifically, each of the metal powders composed of an alloy or a metal shown in the column of "type of metal" in Table 1 was prepared by an atomizing method. The "particle size distribution" shown in Table 1 was determined by a laser diffraction particle size distribution method, and the "composition" was determined by an inductively coupled plasma atomic emission spectrometry (ICP-AES). The "fractal dimension D before firing" was determined by the method described below.

Photographs of 20 metal particles of each metal powder were taken with a scanning electron microscope (SEM), and the fractal dimension of each of the particles was calculated by the divider method described above. The average of the calculated values of the fractal dimensions is inserted in the column of "fractal dimension D before firing" in Table 1.

An organic vehicle was prepared by dissolving an Ethocel resin having a weight-average molecular weight of $5\times10^4$ and an alkyd resin having a weight-average molecular weight of $8\times10^3$ in terpineol. In the organic vehicle, the content of the Ethocel resin was 9.0% by weight, the content of the alkyd resin was 4.5% by weight, and the content of terpineol was 86.5% by weight.

Next, the metal powder and the organic vehicle were prepared so that the volume ratio was 17:83, and the resulting mixture was subjected to a dispersion treatment with a three-roll mill. Thus, the pastes P-1 to P-5 for discharge auxiliary electrodes were prepared.

(3) Preparation of Paste for Discharge Electrode

First, 40% by weight of a Cu powder having an average particle size of 1 μm, 40% by weight of a Cu powder having an average particle size of 3 μm, and 20% by weight of an organic vehicle prepared by dissolving ethyl cellulose in terpineol were prepared, and the resulting mixture was mixed with a three-roll mill. Thus, a paste for a discharge electrode was prepared.

(4) Preparation of Resin Beads Paste for Thermally Removable Layer

A resin beads paste was prepared in order to form a thermally removable layer that is removed by being burnt away during firing to become a cavity. First, 38% by weight of cross-linked acrylic resin beads having an average particle size of 1 μm and 62% by weight of an organic vehicle prepared by dissolving ethyl cellulose in dihydro terpinyl acetate were prepared, and the resulting mixture was mixed with a three-roll mill. Thus, a resin beads paste for a thermally removable layer was prepared.

(5) Preparation of Paste for Outer Terminal Electrode

First, 80% by weight of a Cu powder having an average particle size of about 1 μm, 5% by weight of alkali borosilicate glass frit having a transition point of 620° C. and a softening point of 720° C. and an average particle size of about 1 μm, and 15% by weight of an organic vehicle prepared by dissolving ethyl cellulose in terpineol were prepared, and the resulting mixture was mixed with a three-roll mill. Thus, a paste for an outer terminal electrode was prepared.

(6) Printing of Each Paste

Figure 6:
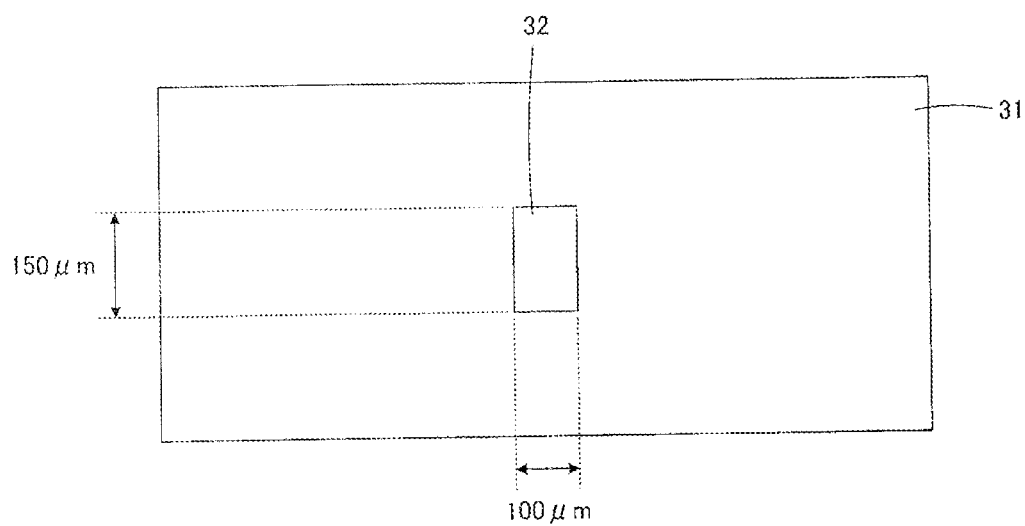
FIG. 6 illustrates a step of producing an ESD protection device 42 prepared in an experimental example and is a plan view showing a state where an unfired discharge auxiliary electrode 32 is formed on a first ceramic green sheet 31.

First, as shown in FIG. 6, a paste for a discharge auxiliary electrode was applied onto a main surface of a ceramic green sheet 31 to form an unfired discharge auxiliary electrode 32 having dimensions of 150 μm×100 μm. In this step, as the paste for a discharge auxiliary electrode, one of the pastes P-1 to P-5 for discharge auxiliary electrodes shown in Table 1 was used as shown in the column of "symbol of paste for discharge auxiliary electrode" in Table 2.

Figure 7:
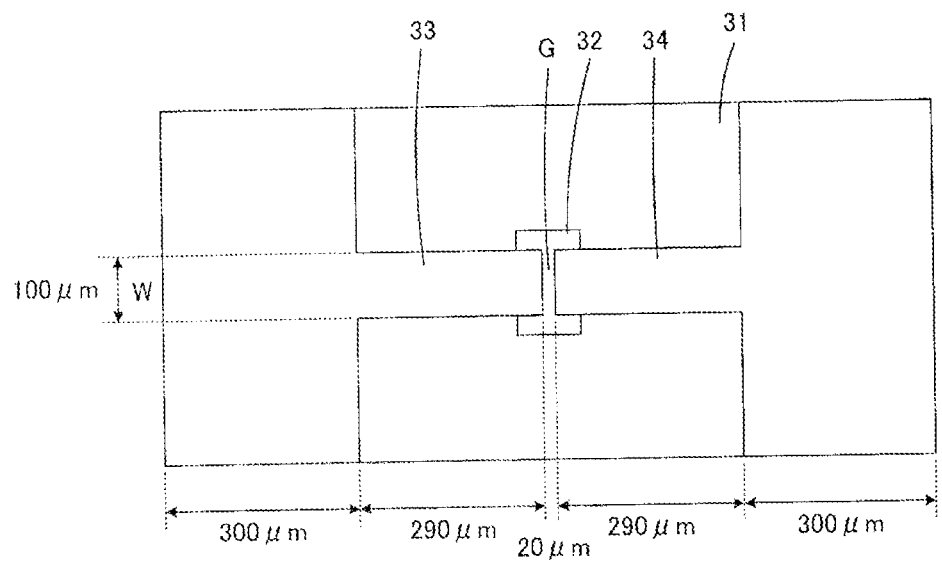
FIG. 7 illustrates a step of producing an ESD protection device 42 prepared in an experimental example and is a plan view showing a state where, after the step shown in FIG. 6, an unfired first discharge electrode 33 and an unfired second discharge electrode 34 are formed.

Subsequently, the paste for a discharge electrode was applied onto the main surface of the ceramic green sheet 31 so as to partially overlap with the unfired discharge auxiliary electrode 32. Thus, an unfired first discharge electrode 33 and an unfired second discharge electrode 34 were formed as shown in FIG. 7. The unfired first discharge electrode 33 and the unfired second discharge electrode 34 face each other with a gap G of 20 μm therebetween on the unfired discharge auxiliary electrode 32. A width W of the facing portion was 100 μm. Dimensions of other portions are also shown in FIG. 7.

Figure 8:
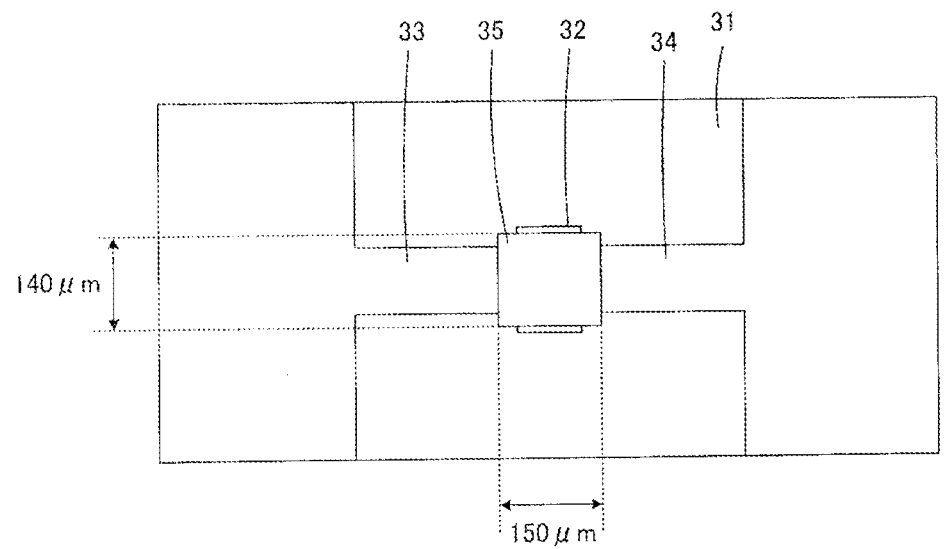
FIG. 8 illustrates a step of producing an ESD protection device 42 prepared in an experimental example and is a plan view showing a state where, after the step shown in FIG. 7, an unfired thermally removable layer 35 is formed.

Next, as shown in FIG. 8, the resin beads paste for a thermally removable layer was applied so as to cover the gap G between the unfired first discharge electrode 33 and the unfired second discharge electrode 34. Thus, an unfired thermally removable layer 35 having dimensions of 140 μm×150 μm was formed.

(7) Stacking and Pressure-Bonding

Figure 9:
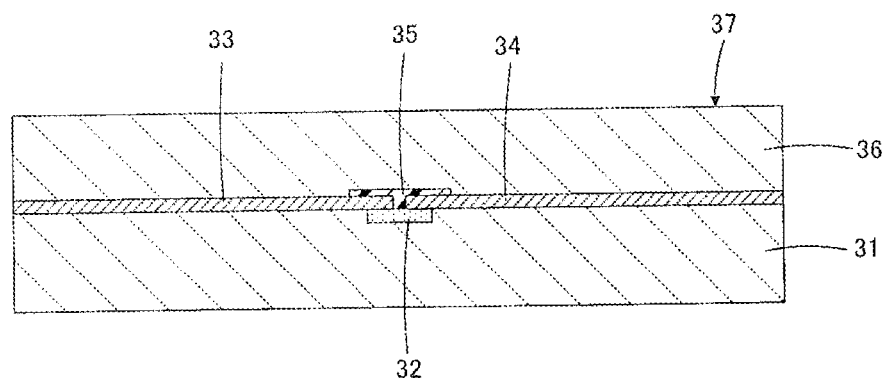
FIG. 9 illustrates a step of producing an ESD protection device 42 prepared in an experimental example and is a cross-sectional view showing a state where, after the step shown in FIG. 8, a second ceramic green sheet 36 is stacked.

As shown in FIG. 9, a plurality of second ceramic green sheets 36 onto which no paste was applied were stacked and pressure-bonded on the main surface of the first ceramic green sheet 31 on which the unfired discharge auxiliary electrode 32, the unfired discharge electrodes 33 and 34, and the unfired thermally removable layer 35 were formed as described above. Thus, an unfired insulator base 37 was prepared. The insulator base 37 was formed so as to have a thickness after firing of 0.3 mm.

(8) Cutting and Printing of Paste for Outer Electrode

The insulator base 37 was cut with a micro-cutter so as to have planar dimensions of 1.0 mm×0.5 mm after firing. It should be understood that the dimensions shown in FIG. 7 and the outer shapes of the ceramic green sheet 31 etc. shown in FIGS. 6 to 9 are dimensions and shapes after this cutting step.

Figure 10:
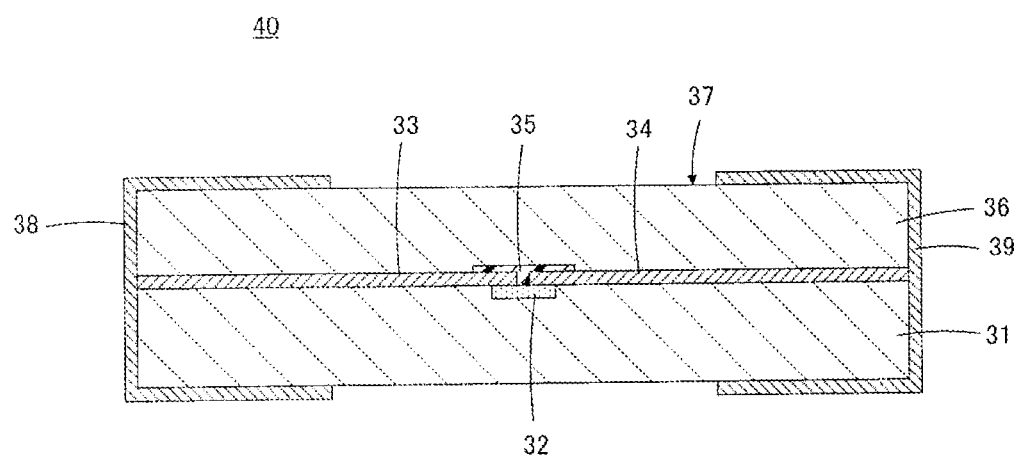
FIG. 10 illustrates a step of producing an ESD protection device 42 prepared in an experimental example and is a cross-sectional view showing a state where, after the step shown in FIG. 9, unfired outer terminal electrodes 38 and 39 are formed.

Subsequently, as shown in FIG. 10, the paste for an outer electrode was applied onto outer surfaces of the insulator base 37, thereby forming an unfired first outer terminal electrode 38 and an unfired second outer terminal electrode 39 that were respectively connected to the first discharge electrode 33 and the second discharge electrode 34. Thus, an unfired ESD protection device 40 was prepared.

(9) Firing

Figure 11:
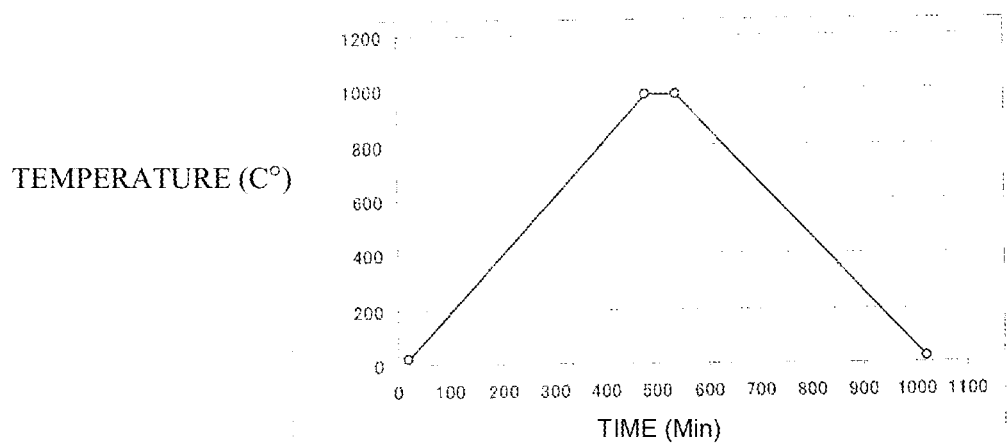
FIG. 11 is a graph showing a firing profile used in a firing step conducted after the step shown in FIG. 10 and in an experimental example.
Figure 12:
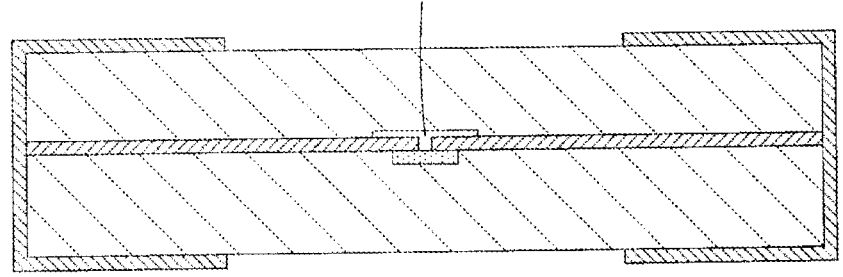
FIG. 12 is a cross-sectional view showing a completed ESD protection device 42 produced by conducting the firing step in an experimental example.

The unfired ESD protection device 40 was fired with the firing profile shown in FIG. 11 to obtain an ESD protection device 42 having a cavity portion 41 and shown in FIG. 12.

In the firing, the atmosphere in a firing furnace was controlled as described in the column of "firing condition" in Table 2 by changing the ratio of $N_2/H_2/H_2O$. The firing conditions A and B in the column of "firing condition" in Table 2 are as follows.

Firing condition A

An oxygen concentration at which copper is not oxidized and aluminum is oxidized.

Firing condition B

An oxygen concentration at which copper and aluminum are oxidized.

An oxygen partial pressure at which each metal used in the discharge auxiliary electrode is oxidized at a temperature T (K) was calculated by the following formulae.

$$\ln(Cu_{PO2}) > \{-338904 + (-33T \log T) + 247 T\}/(8.314T)$$

$$\ln(Al_{PO2}) > \{-1117993 + (-11T \log T) + 244T\}/(8.314T) <$$

<Characteristic Evaluation>

Next, characteristics of the ESD protection device samples prepared as described above were examined by the methods described below.

(1) Structural Characteristics of Metal Particles Contained in Discharge Auxiliary Electrode Each of the ESD protection devices was embedded in an epoxy resin, and the epoxy resin was cured. After curing, an LT surface defined by a side extending in a longitudinal direction and a side extending in a thickness direction was exposed by polishing. The polishing was performed until a surface at a position located halfway through in a width direction was exposed. Subsequently, a focused ion beam (FIB) process was performed on a discharge auxiliary electrode exposed by the polishing.

For the discharge auxiliary electrode sampled by the FIB process, observation with a scanning transmission electron microscope (STEM), and analysis of metals and oxygen with an energy-dispersive X-ray spectrometer (EDS) were conducted. The STEM observation was conducted with an accelerating voltage of 5 kV at a magnification of 5,000 and 25,000. Specifically, first, the entire discharge auxiliary electrode was observed at a magnification of 5,000, and metal particles having a diameter of 1 µm or more were extracted. Images of the metal particles having a diameter of 1 µm or more were then taken at a magnification of 25,000. The fractal dimension was calculated by the method described below using the STEM images.

From the STEM observation and the EDS analysis, whether or not metal particles in the discharge auxiliary electrode "were present as a core portion of core-shell structured particles having a shell portion composed of a metal oxide" was determined. In the column of "core-shell structure" in Table 2, a sample in which a shell portion composed of a metal oxide was observed is denoted by "◯", and a sample in which a shell portion composed of a metal oxide was not observed is denoted by "x". The criteria of "◯" and "x" as to the "core-shell structure" were defined as described above. Specifically, when the length of the entire circumference of the core portion of a metal particle is represented by L1 and the length of the circumference of the core portion covered with the shell portion is represented by L2, a sample having a ratio L2/L1 of 75% or more is determined as "◯" and a sample having a ratio L2/L1 of less than 75% is determined as "x".

For samples in which a shell portion composed of a metal oxide was observed, the type of metal oxide was analyzed. These results are shown in the column of "type of metal oxide in shell portion" in Table 2.

Furthermore, the fractal dimension D of metal particles was calculated by the method described below. First, for the contour of a metal particle having a diameter of 1.0 µm or more in a STEM image, a broken-line approximation was performed under the condition of the length (r) of 1.0 µm, 0.5 µm, and 0.25 µm. Each length (r) and the number N(r) of segments necessary to achieve the broken-line approximation of the contour were plotted in the form of a Richardson plot. The slope of the plot was determined by a least-square method. The fractal dimension D was determined by multiplying the slope by −1. This operation was performed for 20 metal particles. The average of the calculated values of the 20 metal particles was defined as the fractal dimension D, and is inserted in the column of "fractal dimension D" in Table 2.

(2) Initial Short-Circuit Characteristics

An insulation resistance was measured by applying a DC voltage of 50 V between the outer terminal electrodes of each of the ESD protection device samples. When the insulation resistance was $10^8 \Omega$ or more, it was determined that initial short-circuit characteristics were good. This result is denoted by "◯" in the column of "initial short-circuit" in Table 2. When the insulation resistance was less than $10^8 \Omega$, it was determined that initial short-circuit characteristics were not good. This result is denoted by "x" in the column of "initial short-circuit".

In this experimental example, there was no sample which was determined that the initial short-circuit characteristics were not good.

(3) Short-Circuit Resistance

For each of the ESD protection device samples, application of 0.2 kV 10 times→application of 0.4 kV 10 times→application of 0.6 kV 10 times→application of 1 kV 10 times→application of 2 kV 10 times→application of 4 kV 10 times were sequentially performed. The insulation resistance of the sample was measured in each application. When a measured resistance of less than $10^6 \Omega$ was not obtained even once, it was determined that short-circuit resistance was good. This result is denoted by "◯" in the column of "short-circuit resistance". When a resistance of less than $10^6 \Omega$ was measured at least once, it was determined that short-circuit resistance was not good. This result is denoted by "x" in the column of "short-circuit resistance".

In this experimental example, there was no sample that was determined that the short-circuit resistance was not good.

(4) Discharge Characteristics at Low Applied Voltage

A static electricity of 2 kV was applied to each of the ESD protection device samples by using an electrostatic test gun. A voltage measured with an oscilloscope at that time was defined as a peak voltage ($V_{peak}$). When the peak voltage was 300 V or less, it was determined that discharge characteristics at a low applied voltage were good. This result is denoted by "◯" in the column of "discharge characteristics at low applied voltage" in Table 2. When the peak voltage exceeded 300 V, it was determined that discharge characteristics at a low applied voltage were not good. This result is denoted by "x" in the column of "discharge characteristics at low applied voltage".

(5) Comprehensive Evaluation

In the evaluations of the "initial short-circuit", the "short-circuit resistance", and the "discharge characteristics at low applied voltage", for samples evaluated as "◯" in all the evaluation items, "◯" is inserted in the column of "comprehensive evaluation" in Table 2. For samples evaluated as "x" in any of the evaluation items, "x" is inserted in the column of "comprehensive evaluation".

TABLE 2

| | | | | | Characteristic evaluation | | | | |
|---|---|---|---|---|---|---|---|---|---|
| Sample No. | Paste symbol | Firing condition | Core-shell structure | Fractal dimension D | Type of metal oxide in shell portion | Initial short-circuit | Short-circuit resistance | Discharge characteristics at low applied voltage | Comprehensive evaluation |
| *1 | P-1 | A | ○ | 1.02 | $Al_2O_3$ | ○ | ○ | X | X |
| *2 | P-1 | B | X | 1.02 | — | ○ | ○ | X | X |
| 3 | P-2 | A | ○ | 1.08 | $Al_2O_3$ | ○ | ○ | ○ | ○ |
| 4 | P-3 | A | ○ | 1.12 | $Al_2O_3$ | ○ | ○ | ○ | ○ |
| 5 | P-4 | A | ○ | 1.05 | $Al_2O_3$ | ○ | ○ | ○ | ○ |
| 6 | P-5 | A | ○ | 1.03 | $Al_2O_3$ | ○ | ○ | ○ | ○ |

In Table 2, the numbers of samples that are out of the scope of the present invention are marked with symbol *.

Regarding the ESD protection devices of Samples 3 to 6, which are within the scope of the present invention, the metal particle structure in the discharge auxiliary electrode is a core-shell structure including a shell portion composed of a metal oxide, and the fractal dimension D is 1.03 or more. Accordingly, the ESD protection devices of Samples 3 to 6 had excellent ESD protection characteristics (initial short-circuit characteristics, short-circuit resistance, and discharge characteristics at a low applied voltage). In the cases of the metal particles contained in the pastes P-2 to P-5 for discharge auxiliary electrodes used in Samples 3 to 6, as shown in Table 1, an impurity having a melting point lower than that of Cu was contained in the Cu—Al alloy particles. Thus, it is believed that deformation of the core portion easily occurred in the firing process and high fractal dimensions were obtained.

In contrast, regarding the ESD protection device of Sample 1, which is out of the scope of the present invention, since the fractal dimension D was less than 1.03, discharge characteristics at a low applied voltage were not good. In the case of the metal particles contained in the paste P-1 for a discharge auxiliary electrode used in Sample 1, as shown in Table 1, an impurity having a melting point lower than that of Cu was not contained in the Cu—Al alloy particles. Thus, it is believed that deformation of the core portion became difficult to occur in the firing process and the fractal dimension D was less than 1.03.

Regarding the ESD protection device of Sample 2, which is out of the scope of the present invention, the "firing condition" was "B" and the firing was conducted in a firing atmosphere in which copper and aluminum are oxidized. Consequently, copper and aluminum in the metal particles were oxidized, the shell portion of the core-shell structure was not observed, and discharge characteristics at a low applied voltage were not good.

11, 42 ESD protection device
12 insulator base
16, 17 discharge electrode
18 discharge auxiliary electrode
19, 41 cavity
20, 21 outer terminal electrode
22 metal particle
23 shell portion
24 core-shell structured particle
31, 36 ceramic green sheet
32 unfired discharge auxiliary electrode
33, 34 unfired discharge electrode
35 unfired thermally removable layer
37 unfired insulator base
38, 39 unfired outer terminal electrode
40 unfired ESD protection device
G gap

The invention claimed is:

1. An ESD protection device comprising:
a first discharge electrode and a second discharge electrode that are disposed so as to face each other;
a discharge auxiliary electrode formed so as to span between the first discharge electrode and the second discharge electrode; and
an insulator base that holds the first discharge electrode, the second discharge electrode, and the discharge auxiliary electrode,
wherein the discharge auxiliary electrode includes a plurality of metal particles containing a first metal as a main component, and
the metal particles have a fractal dimension D of 1.03 or more.

2. The ESD protection device according to claim 1, wherein the discharge auxiliary electrode includes an aggregate of a plurality of core-shell structured particles each having a core-shell structure that includes a core portion formed of the metal particles and a shell portion containing, as a main component, a metal oxide containing a second metal.

3. The ESD protection device according to claim 2, wherein the second metal is more susceptible to oxidation than the first metal.

4. The ESD protection device according to claim 3, wherein the first metal is copper or a copper-based alloy containing copper as a main component.

5. The ESD protection device according to claim 3, wherein the metal oxide containing the second metal is aluminum oxide.

6. The ESD protection device according to claim 3, wherein the core portion contains the second metal as an auxiliary component.

7. The ESD protection device according to claim 1, wherein the first discharge electrode, the second discharge electrode, and the discharge auxiliary electrode are disposed inside the insulator base, the insulator base has a cavity for creating a gap between the first discharge electrode and the second discharge electrode, and the ESD protection device further comprises a first outer terminal electrode and a second outer terminal electrode that are formed on surfaces of the insulator base and that are respectively electrically connected to the first discharge electrode and the second discharge electrode.

8. A method for producing an ESD protection device comprising the steps of:
preparing an alloy powder composed of an alloy containing a first metal, a second metal that is more susceptible to oxidation than the first metal, and an impurity component having a lower melting point the first metal;
preparing an insulator base;
forming an unfired discharge auxiliary electrode containing the alloy powder on the insulator base;
forming, on a surface of or inside the insulator base, a first discharge electrode and a second discharge electrode that are disposed so as to face each other on the discharge auxiliary electrode; and
firing the unfired discharge auxiliary electrode,
wherein the step of firing the unfired discharge auxiliary electrode includes the steps of,
in each of particles constituting the alloy powder, conducting heat treatment in an atmosphere having an oxygen concentration at which the first metal is not oxidized and the second metal is oxidized in order to obtain core-shell structured particles that include a shell portion containing a metal oxide containing the second metal, the metal oxide being formed by moving the second metal toward the surface of the particle and oxidizing the second metal at the time when the second metal reaches the surface, and a core portion containing metal particles containing, as a main component, the first metal that is left as a result of the movement of the second metal toward the surface of the particle, and
deforming the metal particles that form the core portion in the core-shell structured particles such that a fractal dimension D becomes 1.03 or more.

9. The method for producing an ESD protection device according to claim 8, wherein the step of preparing an alloy powder includes a step of producing the alloy powder by using an atomizing method.

10. The method for producing an ESD protection device according to claim 8, wherein the impurity component is at least one selected from bismuth, phosphorus, and silver.

11. The ESD protection device according to claim 4, wherein the metal oxide containing the second metal is aluminum oxide.

12. The ESD protection device according to claim 4, wherein the core portion contains the second metal as an auxiliary component.

13. The ESD protection device according to claim 5, wherein the core portion contains the second metal as an auxiliary component.

14. The ESD protection device according to claim 2, wherein the first discharge electrode, the second discharge electrode, and the discharge auxiliary electrode are disposed inside the insulator base, the insulator base has a cavity for creating a gap between the first discharge electrode and the second discharge electrode, and the ESD protection device further comprises a first outer terminal electrode and a second outer terminal electrode that are formed on surfaces of the insulator base and that are respectively electrically connected to the first discharge electrode and the second discharge electrode.

15. The ESD protection device according to claim 3, wherein the first discharge electrode, the second discharge electrode, and the discharge auxiliary electrode are disposed inside the insulator base, the insulator base has a cavity for creating a gap between the first discharge electrode and the second discharge electrode, and the ESD protection device further comprises a first outer terminal electrode and a second outer terminal electrode that are formed on surfaces of the insulator base and that are respectively electrically connected to the first discharge electrode and the second discharge electrode.

16. The ESD protection device according to claim 4, wherein the first discharge electrode, the second discharge electrode, and the discharge auxiliary electrode are disposed inside the insulator base, the insulator base has a cavity for creating a gap between the first discharge electrode and the second discharge electrode, and the ESD protection device further comprises a first outer terminal electrode and a second outer terminal electrode that are formed on surfaces of the insulator base and that are respectively electrically connected to the first discharge electrode and the second discharge electrode.

17. The ESD protection device according to claim 5, wherein the first discharge electrode, the second discharge electrode, and the discharge auxiliary electrode are disposed inside the insulator base, the insulator base has a cavity for creating a gap between the first discharge electrode and the second discharge electrode, and the ESD protection device further comprises a first outer terminal electrode and a second outer terminal electrode that are formed on surfaces of the insulator base and that are respectively electrically connected to the first discharge electrode and the second discharge electrode.

18. The ESD protection device according to claim 6, wherein the first discharge electrode, the second discharge electrode, and the discharge auxiliary electrode are disposed inside the insulator base, the insulator base has a cavity for creating a gap between the first discharge electrode and the second discharge electrode, and the ESD protection device further comprises a first outer terminal electrode and a second outer terminal electrode that are formed on surfaces of the insulator base and that are respectively electrically connected to the first discharge electrode and the second discharge electrode.

19. The method for producing an ESD protection device according to claim 9, wherein the impurity component is at least one selected from bismuth, phosphorus, and silver.

* * * * *